(12) United States Patent
Liu et al.

(10) Patent No.: US 10,332,847 B2
(45) Date of Patent: Jun. 25, 2019

(54) SEMICONDUCTOR PACKAGE WITH INTEGRATED HARMONIC TERMINATION FEATURE

(71) Applicant: Infineon Technologies AG, Neubiberg (DE)

(72) Inventors: Yang Liu, Shanghai (CN); Xikun Zhang, Shanghai (CN); Bill Agar, Morgan Hill, CA (US)

(73) Assignee: Infineon Technologies AG, Neubiberg (DE)

( * ) Notice: Subject to any disclaimer, the term of this patent is extended or adjusted under 35 U.S.C. 154(b) by 24 days.

(21) Appl. No.: 15/610,805

(22) Filed: Jun. 1, 2017

(65) Prior Publication Data

US 2018/0350758 A1 Dec. 6, 2018

(51) Int. Cl.
*H01L 23/495* (2006.01)
*H01L 23/047* (2006.01)
(Continued)

(52) U.S. Cl.
CPC ............ *H01L 23/66* (2013.01); *H01L 23/047* (2013.01); *H01L 23/49562* (2013.01); *H01L 23/49575* (2013.01); *H01L 23/585* (2013.01); *H01L 25/072* (2013.01); *H01P 3/081* (2013.01); *H03F 3/193* (2013.01); *H01L 24/48* (2013.01); *H01L 2223/6611* (2013.01); *H01L 2223/6627* (2013.01); *H01L 2223/6644* (2013.01); *H01L 2224/48091* (2013.01); *H01L 2224/48101* (2013.01); *H01L 2224/48106* (2013.01); *H01L 2224/48137* (2013.01);
(Continued)

(58) Field of Classification Search
None
See application file for complete search history.

(56) References Cited

U.S. PATENT DOCUMENTS 4,717,884 A  1/1988 Mitzlaff
5,235,335 A  8/1993 Hester et al.
(Continued)

OTHER PUBLICATIONS

Beltran, Ramon A., "Class-F and Inverse Class-F Power Amplifier Loading Networks Design Based upon Transmission Zeros", Microwave Symposium (IMS), Jun. 1-6, 2014, IEEE MTT-S International, Jul. 10, 2014, pp. 1-4.

*Primary Examiner* — Jay C Chang
(74) *Attorney, Agent, or Firm* — Murphy, Bilak & Homiller, PLLC

(57) ABSTRACT

A semiconductor package includes a metal flange having a lower surface and an upper surface opposite the lower surface. An electrically insulating window frame is disposed on the upper surface of the flange. The electrically insulating window frame forms a ring around a periphery of the metal flange so as to expose the upper surface of the metal flange in a central die attach region. A first electrically conductive lead is disposed on the electrically insulating window frame and extends away from a first side of the metal flange. A second electrically conductive lead is disposed on the electrically insulating window frame and extends away from a second side of the metal flange, the second side being opposite the first side. A first harmonic filtering feature is formed on a portion of the electrically insulating window frame and is electrically connected to the first electrically conductive lead.

16 Claims, 2 Drawing Sheets

(51) Int. Cl.

| | | |
|---|---|---|
| *H01L 23/66* | (2006.01) | |
| *H01L 23/58* | (2006.01) | |
| *H01L 23/00* | (2006.01) | |
| *H01L 25/07* | (2006.01) | |
| *H01P 3/08* | (2006.01) | |
| *H03F 3/193* | (2006.01) | |

(52) U.S. Cl.
CPC ........... *H01L 2224/48175* (2013.01); *H01L 2224/48195* (2013.01); *H01L 2924/13055* (2013.01); *H01L 2924/13064* (2013.01); *H01L 2924/13091* (2013.01); *H01L 2924/19032* (2013.01); *H01L 2924/19041* (2013.01); *H01L 2924/19105* (2013.01); *H03F 2200/165* (2013.01); *H03F 2200/222* (2013.01); *H03F 2200/387* (2013.01); *H03F 2200/451* (2013.01)

(56) References Cited

U.S. PATENT DOCUMENTS

| | | | |
|---|---|---|---|
| 5,300,895 | A | 4/1994 | Jones |
| 5,347,229 | A | 9/1994 | Suckling et al. |
| 5,638,027 | A | 6/1997 | Nagaoka |
| 6,232,841 | B1 | 5/2001 | Bartlett et al. |
| 6,331,931 | B1 | 12/2001 | Titizian et al. |
| 7,911,271 | B1 | 3/2011 | Jia |
| 9,899,967 | B1 * | 2/2018 | Gozzi ................... H01L 23/528 |
| 2007/0057731 | A1 | 3/2007 | Le |
| 2013/0106519 | A1 | 5/2013 | Kamiyama et al. |
| 2016/0294340 | A1 | 10/2016 | Goel et al. |
| 2017/0034913 | A1 | 2/2017 | Mu et al. |
| 2017/0125362 | A1 | 5/2017 | Zhang et al. |

\* cited by examiner

SEMICONDUCTOR PACKAGE WITH INTEGRATED HARMONIC TERMINATION FEATURE

FIELD OF TECHNOLOGY

The present application relates to RF (radio frequency) amplifiers, and in particular relates to impedance matching networks for RF amplifiers.

BACKGROUND

RF power amplifiers are used in a variety of applications such as base stations for wireless communication systems, etc. The signals amplified by the RF power amplifiers often include signals that have a high frequency modulated carrier having frequencies in the 400 megahertz (MHz) to 60 gigahertz (GHz) range. The baseband signal that modulates the carrier is typically at a relatively lower frequency and, depending on the application, can be up to 300 MHz or higher. Many RF power amplifier designs utilize a semiconductor switching device as the amplification device. Examples of these switching devices include power transistor devices, such as a MOSFET (metal-oxide semiconductor field-effect transistor), a DMOS (double-diffused metal-oxide semiconductor) transistor, a GaN HEMT (gallium nitride high electron mobility transistor), a GaN MESFET (gallium nitride metal-semiconductor field-effect transistor), an LDMOS (laterally diffused metal-oxide semiconductor field-effect transistor) transistor, etc.

Highly power efficiency is an important design consideration in modern RF applications. Class D, E, F and J amplifiers are popular choices in modern RF applications in due to their highly efficient operation. Highly efficient operation is achieved by mitigating harmonic oscillations at the input and the output of the amplifier. For example, in a class F amplifier, the output of the amplifier should ideally present a short circuit path to the even ordered harmonics (e.g., $2F_0$, $4F_0$, $6F_0$, etc.) of the fundamental frequency $F_0$, and the output of the amplifier should ideally present an open circuit to the odd ordered harmonics (e.g., $3F_0$, $5F_0$, $7F_0$, etc.) of the fundamental RF frequency $F_0$. For this reason, harmonic filtering components such as resonators and open circuits can be used to selectively filter harmonic components of the fundamental RF frequency $F_0$.

Known techniques for improving amplifier efficiency include incorporating RF filters into the impedance matching networks of RF amplifiers. These RF filters can be incorporated into the printed circuit board (PCB) level impedance matching network and/or the package level impedance matching network. In either case, the impedance matching networks can include LC filters that are tuned to the harmonics of the fundamental frequency $F_0$ so as to provide an electrical short or open circuit, as the case may be.

One drawback of conventional harmonic tuning designs is that higher order harmonics become increasingly difficult to filter with increasing separation from the current source. For example, in the above described configurations, parasitic reactance of the package level and board level conductors substantially influences the propagation of higher frequency signals. As a result, the ability to tune high frequency harmonics, which may be in the range of 4 GHz or higher in modern RF applications, is very limited at the board level.

SUMMARY

According to an embodiment, a semiconductor package is disclosed. The semiconductor package includes a metal flange having a lower surface and an upper surface opposite the lower surface. An electrically insulating window frame is disposed on the upper surface of the flange. The electrically insulating window frame forms a ring around a periphery of the metal flange so as to expose the upper surface of the metal flange in a central die attach region. A first electrically conductive lead is disposed on the electrically insulating window frame and extends away from a first side of the metal flange. A second electrically conductive lead is disposed on the electrically insulating window frame and extends away from a second side of the metal flange, the second side being opposite the first side. A first harmonic filtering feature is formed on a portion of the electrically insulating window frame and is electrically connected to the first electrically conductive lead.

A packaged RF amplifier is disclosed. The packaged RF amplifier includes a metal flange having a lower surface and an upper surface opposite the lower surface. An electrically insulating window frame is disposed on the upper surface of the flange. The electrically insulating window frame forms a ring around a periphery of the metal flange so as to expose the upper surface of the metal flange in a central die attach region. A first electrically conductive RF input lead extends away from a first side of the metal flange. A first RF transistor die is mounted on the metal flange in the central die attach region and being electrically connected to the first RF input lead and the first RF output lead. A first harmonic filtering feature is formed on a portion of the electrically insulating window frame and is electrically connected to the first RF input lead. The first RF transistor die is configured to operate at a first fundamental RF frequency. The first harmonic filtering feature is configured filter a higher order harmonic of the first fundamental RF frequency.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A and 1B, depicts a packaged RF amplifier that includes a harmonic termination feature integrated into the semiconductor package, according to an embodiment. FIG. 1A depicts a plan view perspective of the packaged RF amplifier and FIG. 1B depicts a side view perspective of the packaged RF amplifier.

FIGS. 2A and 28, depicts a packaged RF amplifier that includes a harmonic termination feature integrated into the semiconductor package, according to another embodiment. FIG. 2A depicts a plan view perspective of the packaged RF amplifier and FIG. 28 depicts a side view perspective of the packaged RF amplifier.

DETAILED DESCRIPTION

According to embodiments described herein, a semiconductor package advantageously includes integrated harmonic filtering features incorporated into the window frame and lead design of the package. The semiconductor package can be configured as a surface mount package having a metal flange that provides a die attach area and an electrical terminal for one or more transistor dies mounted thereon. The semiconductor package additionally includes an electrically insulating window frame that is disposed on the metal flange. The window frame has a central opening that exposes a die attach area of the flange. Electrically conductive package leads attach to the window frame adjacent to the die attach area.

The harmonic filtering feature is disposed on a portion of the window frame that is adjacent to the package leads. According to an embodiment, the harmonic filtering feature is provided by a patterned metallization that is disposed on the window frame. This patterned metallization may be continuously connected to any one of the input or output leads, and thus be incorporated into the input our output network of the packaged device. The patterned metallization can be configured as a microstripline component such that microstripline geometries can be selected to provide a desired RF impedance response.

Advantageously, the harmonic filtering feature is formed on an otherwise unused area of the window frame. Therefore, the harmonic filtering feature does not consume any additional package area. As a result, harmonic filtering components can be omitted from package level and/or board level passive electrical networks, thereby enabling an area reduction and/or more space for other components at the package level and/or board level. Moreover, because the harmonic filtering feature is integrated within the package, it is advantageously located very close to the transistor die. As a result, the harmonic filtering feature is highly effective at filtering higher order harmonics in comparison to harmonic filtering features that are disposed further away from the die, e.g., at the board level.

Figure 1:
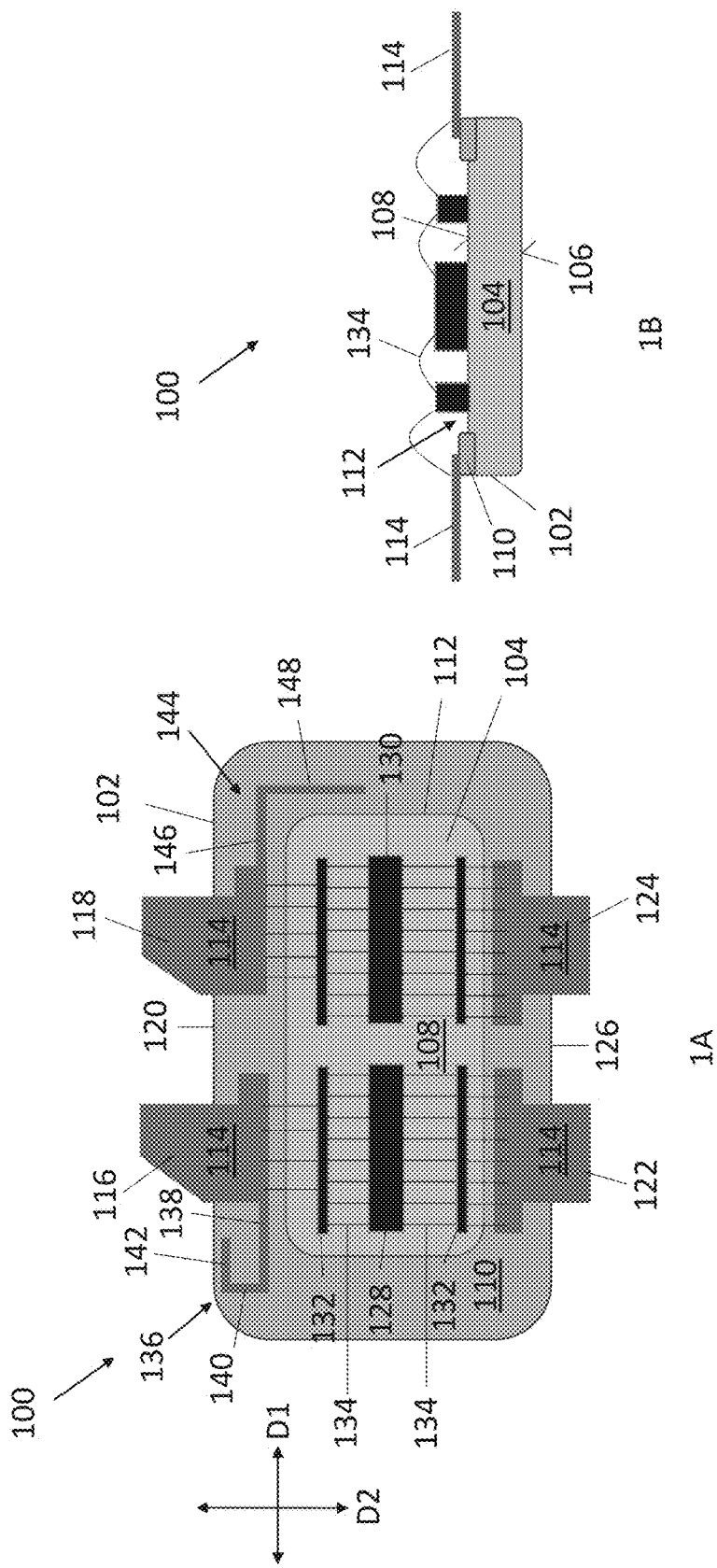
FIG. 1, which includes

Referring to FIG. 1, a packaged RF amplifier 100 is depicted, according to an embodiment. The packaged RF amplifier 100 includes a semiconductor package 102. The semiconductor package 102 includes a metal flange 104. The metal flange 104 can include any thermally (and optionally electrically) conductive material such as Cu, CPC (copper, copper-molybendum, copper laminate structure), CuMo, CuW, Alu, diamond heatspreader, CuMo heatspreader, Cu-composite, Al-composite, diamond-composite, or any other suitable thermally conductive material, and any combination thereof. The metal flange 104 includes a lower surface 106 and an upper surface 108 that is opposite lower surface 106. The lower surface 106 directly interfaces with an external apparatus, e.g., a heat sink or socket of a PCB. The upper surface 108 provides a die attach surface for the package.

The semiconductor package 102 further includes an electrically insulating window frame 110 disposed on the upper surface 108 of the flange. The electrically insulating window frame 110 can include a variety of electrically (and optionally thermally) insulating materials such as ceramic, plastic, etc. The electrically insulating window frame 110 forms a ring around a periphery of the metal flange 104. That is, the electrically insulating window frame 110 forms an enclosed loop over an outer portion of the metal flange 104. Optionally, as shown in the figures, the electrically insulating window frame 110 can extend to the outer edges of the metal flange 104 such that an outer periphery of the metal flange 104 is completely covered by the electrically insulating window frame 110. The electrically insulating window frame 110 includes a central opening 112 that exposes the upper surface 108 of the flange. The exposed upper surface 108 corresponds to a central die attach region of the metal flange 104.

The semiconductor package 102 further includes a plurality of electrically conductive leads 114. Each lead 114 is an electrical connection that includes a metal pad or metal trace that comes from the package. The leads 114 provide electrical access between the packaged components and an external interface, e.g., a printed circuit board. At a minimum, the package includes at least one input lead and at least one output lead. In the depicted embodiment, the package includes first and second input leads 116, 118 extending away from a first side 120 of the package, and further includes first and second output leads 122, 124 extending away from a second side 126 of the package that is opposite from the first side 120. Thus, the package includes pairs of input and output leads 114 that extend away from one another in opposite directions. More generally, the number, shape and dimensioning of the leads 114 may vary depending on, among other things, amplifier configuration, electrical requirements, space requirements, etc.

Each of the electrically conductive leads 114 is disposed on the electrically insulating window frame 110. The electrically conductive leads 114 overlap with the electrically insulating window frame 110 and do not contact the upper surface 108 of the metal flange 104. As a result, the electrically conductive leads 114 are electrically insulated from the metal flange 104. The electrically conductive leads 114 can be affixed to the electrically insulating window frame 110 using, e.g., an adhesive.

In the depicted embodiment, the semiconductor package 102 includes first and second RF transistor dies 128, 130 that are each mounted on the metal flange 104 in the central die attach region. The first and second RF transistor dies 128, 130 can have a variety of different device types, such as LDMOS (laterally diffused metal-oxide-semiconductor), IGBT (insulated gate bipolar transistor), HEMT (high electron mobility electron transistor), etc. These device types can be formed in a variety of different semiconductor material technologies, e.g., Si (silicon), SiC (silicon carbide), SiGe (silicon germanium), GaN (gallium nitride), GaAs (gallium arsenide), etc. In the depicted embodiment, the first and second RF transistor dies 128, 130 have a so-called "source down" configuration. In this configuration, the lower surface of the first and second RF transistor dies 128, 130 includes an exposed electrically conductive source pad. The first and second RF transistor dies 128, 130 are mounted on the flange source down to electrically connect these source pads with the flange. Attachment and electrical connection can be provided by a conductive paste or solder. In this configuration, the metal flange 106 acts as an electrical terminal of the package (e.g., a GND terminal) as well as a mounting surface for the first and second RF transistor dies 128, 130.

In the depicted embodiment, the semiconductor package 102 additionally includes a number of discrete chip capacitors 132 mounted in the die attach area. These chip capacitors 132 have a first (lower) terminal that directly faces and electrically connects to the metal flange 104. A second terminal of these chip capacitors 132 is on an upper side of the chip capacitor 132 and is thus accessible for electrical connection.

In the depicted embodiment, the semiconductor package 102 additionally includes a number of electrically conductive bond wires 134 that provide an electrical connection between the package leads 114 and the various semiconductor devices mounted in the die attach area. More particularly, a group of bond wires 134 electrically connects the input terminals of the first and second RF transistor dies 128, 130 (e.g., the gate terminals) to on the chip capacitors 134, which in turn are connected to the first and second input leads 116, 118. This network provides a reactive input circuit for the packaged amplifier. The bond wires 134 act as inductors in this network, and the height and spacing of the bond wires 134 can be adjusted to provide a desired inductance. This reactive input circuit can be configured to, among other things, match an input impedance of the amplifier circuit to a fixed value, e.g., 50 ohms. Another group of electrically conductive bond wires 134 can be used to provide an electrical connection between the output terminals of the first and second RF transistor dies 128, 130 (e.g., the drain terminals) to another one of the chip capacitors 134, which in turn is connected to the first and second output leads 122, 124. This network can be configured in a corresponding manner to match an output impedance of the amplifier circuit to a fixed value.

More generally, the packaged RF amplifier 100 can include any of a variety of different active and passive components, e.g., transistors, diodes, resistors, inductors, capacitors, etc., mounted on the metal flange 102 in the central die attach region. A variety of different electrical conductors such as bond wires, ribbons, etc. can be used provide electrical connections between the leads 114 and the different active and passive components mounted in the central die attach region. These components collectively can be used to provide a given amplifier circuit topology.

The semiconductor package 102 further includes harmonic filtering features that are formed on the window frame. These harmonic filtering features form part of the reactive networks that connect the first and second RF transistor dies 128, 130 and the leads 114. The harmonic filtering features provide an RF filter (i.e., a shunt or open circuit) to higher order harmonics (e.g., second order harmonic, third order harmonic, fourth order harmonic, etc.) of the fundamental RF frequency of the amplifier. That is, an impedance profile of the harmonic filtering features includes a local maxima or minima at the higher order harmonics. The frequency response of the harmonic filtering features is dependent upon the dimensioning, geometry and overall configuration of the harmonic filtering features. Thus, the geometric features of the harmonic filtering features can be adjusted to provide an RF short or open at a desired frequency.

In the depicted embodiment, a first harmonic filtering feature 136 is electrically connected to the first electrically conductive input lead. The first harmonic filtering feature 136 is formed on a portion of the electrically insulating window frame 110 that is between the first electrically conductive input lead and outer edges of the flange. The first harmonic filtering feature 136 is formed in a first metallization layer that is disposed on the electrically insulating window frame 110. The first metallization layer can include any electrically conductive metal, such as copper, aluminum and alloys thereof. The first harmonic filtering feature 136 can be formed by a patterning technique whereby metallization is deposited on the electrically conductive window frame and subsequently etched away. Alternatively, the first harmonic filtering feature 136 can be formed as part of an electrically conductive lead frame that is attached to the package using an adhesive. The first metallization layer that is used to form the first harmonic filtering feature 136 can be, but is not necessarily, the same metallization layer that forms the electrically conductive input and output leads 114. The first harmonic filtering feature 136 can be continuously connected to the first electrically conductive input lead 116 via the first metallization layer. That is, the first harmonic filtering feature 136 can directly contact the first electrically conductive input lead 116 with a section of the first metallization layer. Alternatively, electrical connectors such as bond wires 134, ribbons etc. may be used to connect the first harmonic filtering feature 136 to the first electrically conductive input lead 116.

The first harmonic filtering feature 136 can be configured as an open stub in the reactive network between the input terminal of the first RF transistor die 128 and the first input lead 116. In an open stub configuration, the first harmonic filtering feature 136 does not provide a direct conductive path to any terminal. Instead, the first harmonic filtering feature 136 serves to influence the propagation of RF signals travelling between the first RF transistor die 128 and the first input lead 116.

The first harmonic filtering feature 136 can be configured as a microstripline component. Microstripline refers to a transmission line configuration in which a conductive strip (i.e., the transmission line) is separated from a conductive sheet by an insulating layer, with the conductive sheet being set at a reference potential (e.g. GND). In this package, the metal flange 104 provides the lower conductive sheet of the microstripline, the electrically insulating window frame 110 provides the insulating layer of the microstripline, and elongated strips of the first metallization layer provide the conductive strip of the microstripline. The impedance presented by the conductive strip depends on its geometry. Generally speaking, as the complexity of the shape formed by the conductive strip increases, e.g., with a greater number of turns, angles, changes in shape, etc., the characteristic RF impedance of the conductive strip becomes more complex due to RF reflections. Due to this phenomenon, virtually any desired RF impedance can be achieved by appropriately tailoring the shape of the conductive sheet.

According to an embodiment, the geometry of the first harmonic filtering feature 136 is tailored such that the first harmonic filtering feature 136 appears as an RF shunt at a higher order harmonics of the fundamental RF frequency that the first RF transistor die 128 is operating at. That is, the first harmonic filtering feature 136 is designed to resonate at the higher order harmonics of the fundamental RF opeting frequency of the first RF transistor die 128 such that these higher order harmonics do not further propagate across the passive network. According to a more particular embodiment, the first RF transistor die 128 is configured to operate at a first fundamental RF frequency in the range of 1.8 GHz-2.2 GHz, with a center frequency of 2.0 GHz, and the first harmonic filtering feature 136 presents an RF shunt at a second order harmonic of the center frequency, i.e., 4.0 GHz. Similar principles can be used to configure the first harmonic filtering feature 136 to appear as an open (i.e., blocking) component.

In the depicted embodiment, the first harmonic filtering feature 136 is configured as a microstripline open stub with a first elongated span 138 of microstripline that is continuously connected to the first electrically conductive input lead 116 and extends away from the first electrically conductive input lead 116 in a first direction (D1). The first harmonic filtering feature 136 further includes a second elongated span 140 of microstripline that is continuously connected to the first elongated span 138 of microstripline and extends away from the first elongated span 138 of microstripline towards the first side 120 of the metal flange 104 in a second direction (D2) that is perpendicular to the first direction (D1). The first harmonic filtering feature 136 further includes a third elongated span 142 of microstripline that is continuously connected to the second elongated span 140 of microstripline and extends away from the second elongated span 140 of microstripline and towards the first electrically conductive lead in the first direction (D1).

The semiconductor package 102 additionally includes a second harmonic filtering feature 144 that is electrically connected to the second electrically conductive input lead. The second harmonic filtering feature 144 is formed on a portion of the electrically insulating window frame 110 that is between the second electrically conductive input lead 118 and outer edges of the metal flange 104. The second harmonic filtering feature 144 can also be formed in the first metallization layer. The second harmonic filtering feature 144 can be configured to provide harmonic filtering to the passive network that is connected between the second RF transistor die and the second electrically conductive input lead 118 in a similar manner as previously described with reference to the first harmonic filtering feature 136. That is, the second harmonic filtering feature 144 can be configured as an open stub, and more particularly as a microstripline open stub, that is configured to appear as an RF shunt to a higher order harmonic component of a center frequency that the second RF transistor die 130 operates at.

In the depicted embodiment, the second harmonic filtering feature 144 is configured as a microstripline open stub with a fourth elongated span 146 of microstripline that is continuously connected to the second RF input lead 118 and extends away from the second RF input lead 118 in the first direction (D1). The second harmonic filtering feature 144 additionally includes a fifth elongated span 148 of microstripline that is continuously connected to the fourth elongated span 146 of microstripline and extends away from the fourth elongated span 146 of microstripline towards the second side 126 of the metal flange 104 in the second direction (D2).

Figure 2:
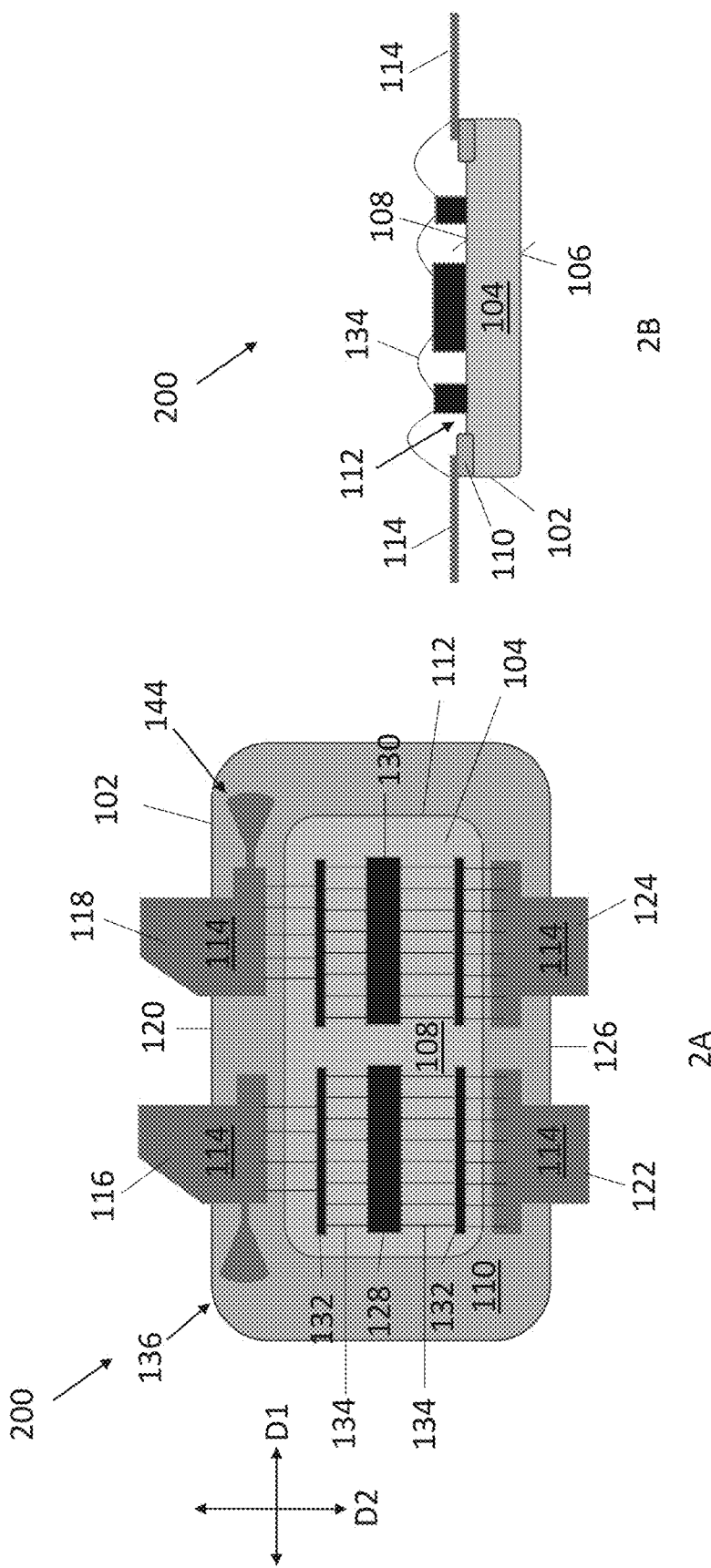
FIG. 2, which includes

Referring to FIG. 2, a packaged RF amplifier 200 is depicted, according to another embodiment. The packaged RF amplifier 200 of FIG. 2 has the same configuration as the packaged RF amplifier 100 of FIG. 1 with the exception of the configuration of the first and second harmonic filtering features 136, 144. In the embodiment of FIG. 2, the first and second harmonic filtering features 136, 144 are configured as radial stubs. A radial stub refers to a microstripline feature in which the transmission line gradually expands and has a curved outer edge at the widest portion of the transmission line. Radial stubs represent another microstripline geometry for providing an RF shunt at a desired frequency. Thus, the depicted radial stubs can be used to filter out higher order harmonics of the fundamental frequency that the first and second RF transistor dies 128, 130 operate at in a similar manner as described above.

The embodiments described with reference to FIGS. 1 and 2 represent two examples of a wide variety of semiconductor packages with integrated harmonic filtering utilizing the principles described herein. The principles described herein can be used to form any of a wide variety of different harmonic filtering features using a structured metallization feature that is disposed on the electrically insulating window frame 110. The shape of the harmonic filtering features can be tailored using known modeling techniques to provide any desired impedance response. For example, the shape of the harmonic filtering features can be tailored to electrically shunt even ordered harmonics higher than the second order harmonic (e.g., fourth harmonics, sixth harmonics, etc.). In addition or in the alternative, the shape of the harmonic filtering features can be tailored to present infinite resistance at odd ordered harmonics such as the third harmonic, fifth harmonic, etc. The location of the harmonic filtering features can vary from what is shown. Generally speaking, the harmonic filtering features can be formed on any open region of the electrically conductive window frame that does not contact another conductive structure, e.g., a package lid.

In the above described embodiments, the harmonic filtering features are incorporated into the input networks of the packaged RF amplifier. Similar principles can be used to provide harmonic filtering features into the output networks of the packaged RF amplifier. That is, the harmonic filtering features can be connected to the first and second electrically conductive output leads 122, 124 to produce a similar result.

The term "electrically connected" describes a permanent low-ohmic, i.e., low-resistance, connection between electrically connected elements, for example a wire connection between the concerned elements. An electrical connection is nominally a zero impedance connection. By contrast, the term "electrically coupled" contemplates a connection in which there is not necessarily nominally zero impedance connection between coupled elements. For instance, active elements, such as transistors, as well as passive elements, such as inductors, capacitors, diodes, resistors, etc., may electrically couple two elements together.

Terms such as "same," "match," and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like are used to describe various elements, regions, sections, etc., and are also not intended to be limiting. Like terms refer to like elements throughout the description.

Spatially relative terms such as "under," "below," "lower," "over," "upper," and the like are used for ease of description to explain the positioning of one element relative to a second element. These terms are intended to encompass different orientations of the device in addition to different orientations than those depicted in the figures. Further, terms such as "first," "second," and the like are also used to describe various elements, regions, sections, etc. and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a," "an," and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
    a metal flange comprising a lower surface and an upper surface opposite the lower surface;
    an electrically insulating window frame disposed on the upper surface of the flange, the electrically insulating window frame forming a ring around a periphery of the metal flange so as to expose the upper surface of the metal flange in a central die attach region;
    a first electrically conductive lead being disposed on the electrically insulating window frame and extending away from a first side of the metal flange;

a second electrically conductive lead being disposed on the electrically insulating window frame and extending away from a second side of the metal flange, the second side being opposite the first side; and a first harmonic filtering feature formed on a portion of the electrically insulating window frame and electrically connected to the first electrically conductive lead.

2. The semiconductor package of claim 1, wherein the first harmonic filtering feature is formed in a metallization layer that is disposed on the electrically insulating window frame and is continuously connected to the first electrically conductive lead.

3. The semiconductor package of claim 2, wherein the first harmonic filtering feature forms a first microstripline open stub.

4. The semiconductor package of claim 3, wherein the first microstripline open stub open stub comprises:
a first elongated span of microstripline that is continuously connected to the first electrically conductive lead and extends away from the first electrically conductive lead;
a second elongated span of microstripline that is continuously connected to the first elongated span of microstripline and extends away from the first elongated span of microstripline towards the first side of the metal flange; and
a third elongated span of microstripline that is continuously connected to the second elongated span of microstripline and extends away from the second elongated span of microstripline and towards the first electrically conductive lead.

5. The semiconductor package of claim 4, further comprising:
a third electrically conductive lead being disposed on the electrically insulating window frame and extending away from the first side of the metal flange, the third electrically conductive lead being spaced apart from and parallel to the first electrically conductive lead;
a fourth electrically conductive lead being disposed on the electrically insulating window frame and extending away from the second side of the metal flange, the fourth electrically conductive lead being spaced apart from and parallel to the second electrically conductive lead; and
a second harmonic filtering feature being formed on a portion of the electrically insulating window frame and electrically connected to the third electrically conductive lead.

6. The semiconductor package of claim 5, wherein the second harmonic filtering feature forms a second microstripline open stub, wherein the second microstripline open stub comprises:
a fourth elongated span of microstripline that is continuously connected to the third electrically conductive lead and extends away from the third electrically conductive lead; and
a fifth elongated span of microstripline that is continuously connected to the fourth elongated span of microstripline and extends away from the fourth elongated span of microstripline towards the second side of the metal flange.

7. The semiconductor package of claim 2, wherein the second harmonic filtering feature forms a radial stub.

8. A packaged amplifier, comprising:
a metal flange comprising a lower surface and an upper surface opposite the lower surface;

an electrically insulating window frame disposed on the upper surface of the flange, the electrically insulating window frame forming a ring around a periphery of the metal flange so as to expose the upper surface of the metal flange in a central die attach region;
a first electrically conductive RF (radio frequency) input lead extending away from a first side of the metal flange;
a first electrically conductive RF output lead extending away from a second side of the metal flange, the second side being opposite the first side;
a first RF transistor die being mounted on the metal flange in the central die attach region and being electrically connected to the first RF input lead and the first RF output lead, and
a first harmonic filtering feature formed on a portion of the electrically insulating window frame and electrically connected to the first RF input lead,
wherein the first RF transistor die is configured to operate at a first fundamental RF frequency, and
wherein the first harmonic filtering feature is configured to filter a higher order harmonic of the first fundamental RF frequency.

9. The packaged amplifier of claim 8, wherein the first harmonic filtering feature is formed in a metallization layer that is disposed on the electrically insulating window frame and is continuously connected to the first RF input lead.

10. The packaged amplifier of claim 9, wherein the first harmonic filtering feature forms a first microstripline open stub.

11. The packaged amplifier of claim 10, wherein the first microstripline open stub open stub comprises:
a first elongated span of microstripline that is continuously connected to the first RF input lead and extends away from the first RF input lead;
a second elongated span of microstripline that is continuously connected to the first elongated span of microstripline and extends away from the first elongated span of microstripline towards the first side of the metal flange; and
a third elongated span of microstripline that is continuously connected to the second elongated span of microstripline and extends away from the second elongated span of microstripline and towards the first electrically conductive lead.

12. The packaged amplifier of claim 11, wherein the first harmonic filtering feature is configured to appear as an RF shunt a second order harmonic of the first fundamental RF frequency.

13. The packaged amplifier of claim 12, wherein the fundamental RF frequency is in the range of 1.8 Ghz-2.2 GHz.

14. The packaged amplifier of claim 11, further comprising:
a second electrically conductive RF input lead extending away from the first side of the metal flange;
a second electrically conductive RF output lead extending away from the second side of the metal flange;
a second RF transistor die being mounted on the metal flange in the central die attach region and being electrically connected to the second RF input lead and the second RF output lead, and
a second harmonic filtering feature formed on a portion of the electrically insulating window frame and electrically connected to the second RF input lead,
wherein the second RF transistor die is configured to operate at a second fundamental RF frequency, and wherein the second harmonic filtering feature is configured to filter a higher order harmonic of the second fundamental RF frequency.

15. The packaged amplifier of claim 14, wherein the second harmonic filtering feature forms a second microstripline open stub, wherein the second microstripline open stub comprises:
  a fourth elongated span of microstripline that is continuously connected to the second RF input lead and extends away from the second RF input lead; and
  a fifth elongated span of microstripline that is continuously connected to the fourth elongated span of microstripline and extends away from the fourth elongated span of microstripline towards the second side of the metal flange.

16. The packaged amplifier of claim 9, wherein the second harmonic termination forms a radial stub.

\* \* \* \* \*